United States Patent
Igarashi

(10) Patent No.: US 10,445,206 B2
(45) Date of Patent: Oct. 15, 2019

(54) SEMICONDUCTOR DEVICE

(71) Applicant: RENESAS ELECTRONICS CORPORATION, Tokyo (JP)

(72) Inventor: Mitsuhiko Igarashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 82 days.

(21) Appl. No.: 15/707,710

(22) Filed: Sep. 18, 2017

(65) Prior Publication Data

US 2018/0089052 A1 Mar. 29, 2018

(30) Foreign Application Priority Data

Sep. 23, 2016 (JP) .................. 2016-185353

(51) Int. Cl.
| | |
|---|---|
| *G06F 11/34* | (2006.01) |
| *H03K 3/03* | (2006.01) |
| *G06F 11/00* | (2006.01) |
| *G06F 11/07* | (2006.01) |
| *G01R 31/3185* | (2006.01) |

(Continued)

(52) U.S. Cl.
CPC ...... *G06F 11/3419* (2013.01); *G01R 31/3016* (2013.01); *G01R 31/318505* (2013.01); *G06F 11/008* (2013.01); *G06F 11/076* (2013.01); *G11C 29/021* (2013.01); *G11C 29/023* (2013.01); *G11C 29/025* (2013.01); *H03K 3/0315* (2013.01)

(58) Field of Classification Search
CPC .... H03K 3/0315; H03K 3/354; G01R 31/275; G01R 31/2851; G01R 31/2856; G01R 31/2882; G01R 31/31725; G01R 31/31727; G11C 29/023
See application file for complete search history.

(56) References Cited

U.S. PATENT DOCUMENTS 7,205,854 B2 * 4/2007 Liu .................. G01R 31/31703
324/750.3
7,307,471 B2 * 12/2007 Gammie ............ H03K 19/0008
327/541

(Continued)

FOREIGN PATENT DOCUMENTS

JP 2012-202722 A 10/2012

*Primary Examiner* — Ryan Johnson
(74) *Attorney, Agent, or Firm* — McDermott Will & Emery LLP

(57) ABSTRACT

A ring oscillator for detecting a characteristic degradation of MOSFETs is required to be highly sensitive to NBTI degradation or PBTI degradation. A semiconductor device comprises a ring oscillator and a delay detecting circuit which detects a delay through gate circuits based on the oscillation frequency of the ring oscillator. The ring oscillator comprises an input terminal to which an oscillation control signal is input, an output terminal which outputs an oscillation signal, an oscillation control gate circuit having a first input terminal which is coupled to the input terminal and a second input terminal to which a terminal different from the input terminal is coupled, NAND circuits, and NOR circuits. The NAND and NOR circuits are cascade coupled alternately, plural inputs of the NAND circuits and of the NOR circuits are coupled together, and drive power of the NAND circuits differs from drive power of the NOR circuits.

10 Claims, 12 Drawing Sheets

(51) Int. Cl.
   *G11C 29/02* (2006.01)
   *G01R 31/30* (2006.01)

(56) References Cited

U.S. PATENT DOCUMENTS

| | | | |
|---|---|---|---|
| 7,495,519 B2* | 2/2009 | Kim | G01R 31/31725 331/44 |
| 9,035,706 B2* | 5/2015 | Chen | G01R 31/2882 331/55 |
| 9,866,221 B2* | 1/2018 | Jenkins | H03L 7/00 |
| 2017/0160339 A1* | 6/2017 | Jenkins | G01R 31/2882 |

* cited by examiner

SEMICONDUCTOR DEVICE

CROSS-REFERENCE TO RELATED APPLICATIONS

The disclosure of Japanese Patent Application No. 2016-185353 filed on Sep. 23, 2016 including the specification, drawings and abstract is incorporated herein by reference in its entirety.

BACKGROUND

The present invention disclosed herein relates semiconductor device and is, for example, applicable semiconductor device equipped with a ring oscillator for detecting a delay.

As significant characteristic degradations of micro CMOS processes, there are a Bias Temperature Instability (BTI) degradation and a Dielectric Breakdown degradation. The BTI degradation is further classified into two types: Negative Bias Temperature Instability (NBTI) degradation and Positive Bias Temperature Instability (PBTI) degradation. NBTI degradation refers to a phenomenon such that, when the temperature of a chip rises in a condition that the substrate potential of a P-channel MOS transistor is back biased with respect to a gate potential, an absolute value of the transistor's threshold voltage increases gradually and the transistor speed slows down, as time passes. PBTI degradation refers to a phenomenon such that, when the temperature of a chip rises in a condition that the substrate potential of an N-channel MOS transistor is forward biased with respect to a gate potential, an absolute value of the transistor's threshold voltage increases gradually and the transistor speed slows down, as time passes.

Delay caused by, inter alfa, a characteristic degradation of MOSFETs, as described above, is detected by a ring oscillator or the like. A ring oscillator is an oscillator configured by coupling gate circuits, each producing an output by inverting its input, in a ring form with odd numbered stages. Besides a ring oscillator which is comprised of inverters as the gate circuits, usage of a ring oscillator which is comprised of NAND circuits or a ring oscillator which is comprised of NOR circuits is proposed (Japanese Unexamined Patent Application Publication No. 2012-202722).

RELATED ART DOCUMENT

Patent Document

[Patent Document 1]
Japanese Unexamined Patent Application Publication No. 2012-202722

SUMMARY

A ring oscillator for detecting a characteristic degradation of MOSFETs is required to be highly sensitive to NBTI degradation or PBTI degradation.

Other problems and novel features will be apparent from the description in the present specification and the attached drawings.

A representative aspect of the invention disclosed herein is summarized as below:

A semiconductor device includes a delay detecting circuit with a ring oscillator which is comprised of first gate circuits and second gate circuits which are cascade coupled alternately. Drive power of the first gate circuits differs from drive power of the second gate circuits.

According to the above semiconductor device, it is possible to detect NBTI degradation or PBTI degradation at high sensitivity.

DETAILED DESCRIPTION

In the following, an embodiment, embodiment examples, a comparison example, and application examples will be described with the aid of the drawings. In the following description, however, identical components are assigned identical reference signs and duplicated descriptions may be omitted.

As a semiconductor which is comprised of MOS transistors continues to be used for long years, propagation delay time (tD) of gate circuits caused by NBTI degradation or PBTI degradation continues to increase. Consequently, for a ring oscillator that is arranged to produce an oscillation output using odd numbered stages of gate circuits, its characteristics change gradually and its oscillation frequency becomes lower (oscillation period becomes longer). That is, the ring oscillator is a circuit by which a delay of gate circuits is detected through its oscillation frequency (oscillation period) and can be used as a circuit for detecting NBTI degradation or PBTI degradation (a circuit for detecting a decrease in reliability).

Besides, as an operating voltage decreases, the propagation delay time (tD) of gate circuits increases. Consequently, as the operating voltage decreases, the frequency of the ring oscillator becomes lower (the oscillation period becomes longer). That is, the ring oscillator is a circuit by which a delay of gate circuits is detected through its oscillation frequency (oscillation period) and can be used as a circuit for detecting a decrease in the operating voltage (a circuit for detecting voltage depression).

It is preferable that the ring oscillator as a circuit for detecting a decrease in reliability has high sensitivity to NBTI degradation or PBTI degradation, whereas it is preferable that the ring oscillator as a circuit for detecting voltage depression has low sensitivity to NBTI degradation or PBTI degradation.

Figure 1:
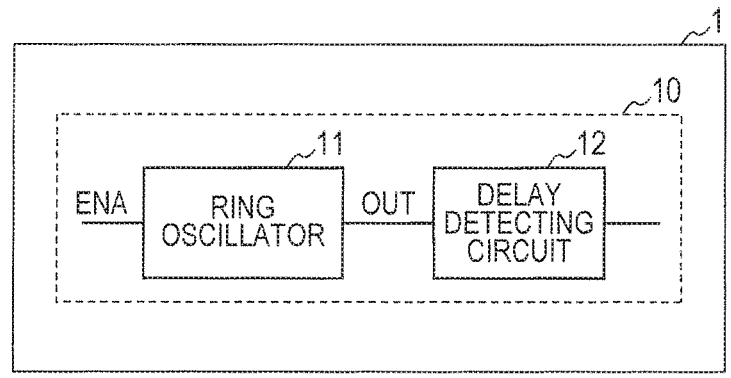
FIG. 1 is a block diagram depicting a configuration of a semiconductor device pertaining to an embodiment.
Figure 2:
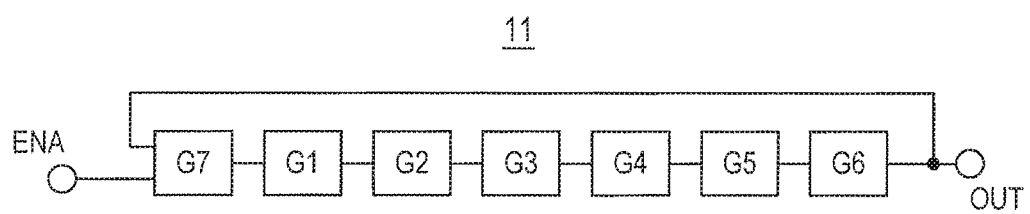
FIG. 2 is a block diagram depicting one example of a ring oscillator in FIG. 1.
Figure 3:
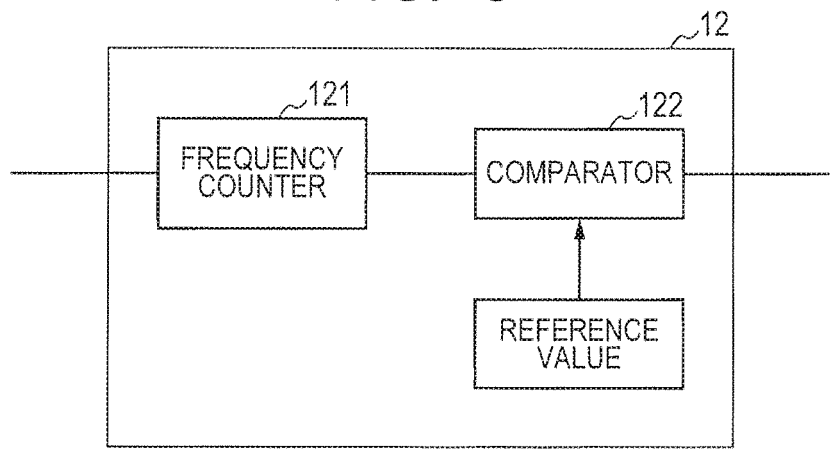
FIG. 3 is a block diagram depicting one example of a delay detecting circuit in FIG. 1.

A configuration of a semiconductor device pertaining to an embodiment is described with FIGS. 1 through 3. FIG. 1 is a block diagram depicting a configuration of a semiconductor device pertaining to an embodiment. FIG. 2 is a block diagram depicting one example of a ring oscillator in FIG. 1. FIG. 3 is a block diagram depicting one example of a delay detecting circuit in FIG. 1. As depicted in FIG. 1, the semiconductor device 1 is equipped with a monitoring circuit 10 in one semiconductor chip (semiconductor substrate). The monitoring circuit 10 includes a ring oscillator 11 and a delay detecting circuit 12 which detects a delay through gate circuits based on the oscillation frequency of the ring oscillator 11.

As depicted in FIG. 2, the ring oscillator 11 is configured by coupling gate circuits G1 through G7, each producing an output by inverting its input, in a ring form with odd numbered stages. Gate circuits G1 through G6 are those with plural inputs and the plural inputs are coupled together. A gate circuit G7 is the one with two inputs and an oscillation control signal (ENA) and an output of a gate circuit G6 are input thereto. According to state of the oscillation control signal ENA, the ring oscillator 11 oscillators or stops oscillation. The output of the gate circuit G6 is extracted as an oscillation signal (OUT); however, a gate circuit from which the oscillation signal is extracted is not limited to the gate circuit G6 and the signal may be extracted from any gate circuit.

Gate circuits G1, G3, G5 in odd numbered stages are those each having an identical configuration and gate circuits G2, G4, G6 in even numbered stages are those each having an identical configuration. The configuration of the gate circuits G1, G3, G5 in odd numbered stages differs from the configuration of a gate circuit G6 in an even numbered stage. The number of stages of gate circuits is not limited to seven stages and only needs to be odd numbered stages. The gate circuits G1 through G7 are configured using CMOS transistors. For the gate circuits G1, G3, G5 in odd numbered stages, plural NMOS transistors are coupled in series between an output and a low reference potential. For the gate circuits G2, G4, G6 in even numbered stages, plural PMOS transistors are coupled in series between and output and a high reference potential. The ring oscillator is configured by cascade coupling NAND circuits comprised of CMOS transistors and NOR circuits comprised of CMOS transistors alternately and the drive power of the NAND circuits differs from the drive power of the NOR circuits.

As depicted in FIG. 3, the delay detecting circuit 12 includes a frequency counter 121 which counts the oscillation frequency and a comparator 122 which compares a count value of the frequency counter 121 with a reference value. When there is a match between a count value of the frequency counter 121 and the reference value, the comparator 122 asserts an output signal. The reference value is a count value (initial value) of the frequency counter in a condition when no degradation develops, for instance, when the semiconductor device has been manufactured or a count value (threshold value) of the frequency counter at a predetermined voltage.

It is possible to obtain a detection circuit (a circuit for detecting a decrease in reliability) having high sensitivity to PBTI degradation by putting the ring oscillator in which NAND circuits with relatively small drive power and NOR circuits with relatively large drive power are alternately coupled into oscillating operation, counting the oscillating frequency, and comparing the count value with an initial value. It is also possible to obtain a delay monitoring circuit (a circuit for detecting voltage depression) for which an influence of NBTI degradation has been reduced to a large extent by putting the ring oscillator in which NAND circuits with relatively small drive power and NOR circuits with relatively large drive power are alternately coupled into oscillating operation, counting the oscillating frequency, and comparing the count value with a threshold value.

It is possible to obtain a detection circuit (a circuit for detecting a decrease in reliability) having high sensitivity to NBTI degradation by putting the ring oscillator in which NAND circuits with relatively large drive power and NOR circuits with relatively small drive power are alternately coupled in oscillating operation, counting the oscillating frequency, and comparing the count value with an initial value. It is also possible to obtain a delay monitoring circuit (a circuit for detecting voltage depression) for which an influence of PBTI degradation has been reduced to a large extent by putting the ring oscillator in which NAND circuits with relatively large drive power and NOR circuits with relatively small drive power are alternately coupled into oscillating operation, counting the oscillating frequency, and comparing the count value with a threshold value.

Embodiment Example 1

Figure 4:
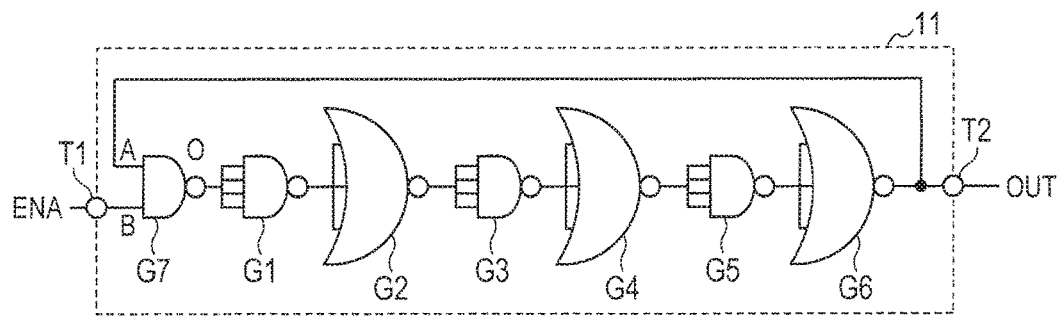
FIG. 4 is a circuit diagram depicting one example of the ring oscillator in FIG. 2.
Figure 5:
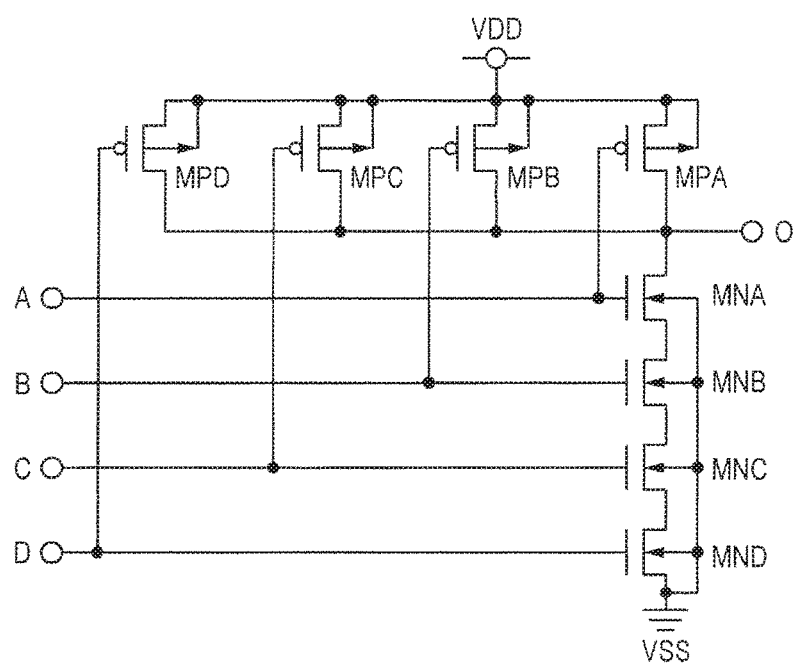
FIG. 5 is a concrete configuration example of a NAND circuit with four inputs in FIG. 4.
Figure 6:
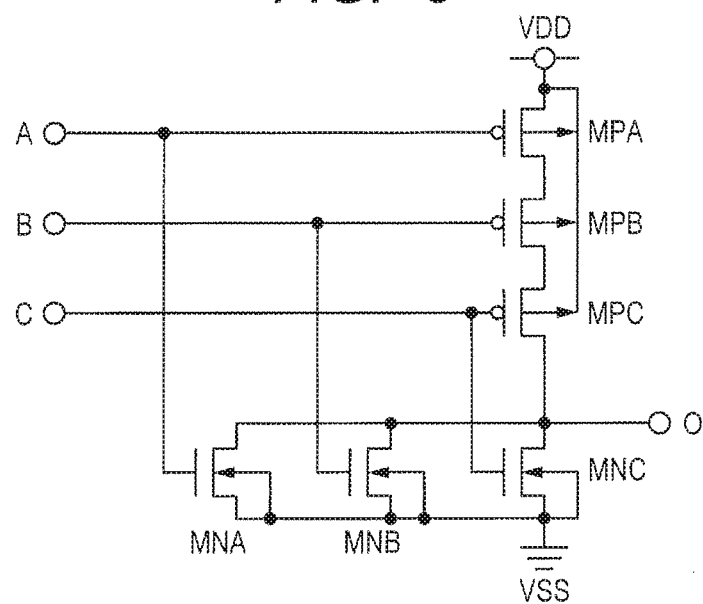
FIG. 6 is a concrete configuration example of a NOR circuit with three inputs in FIG. 4.
Figure 7:
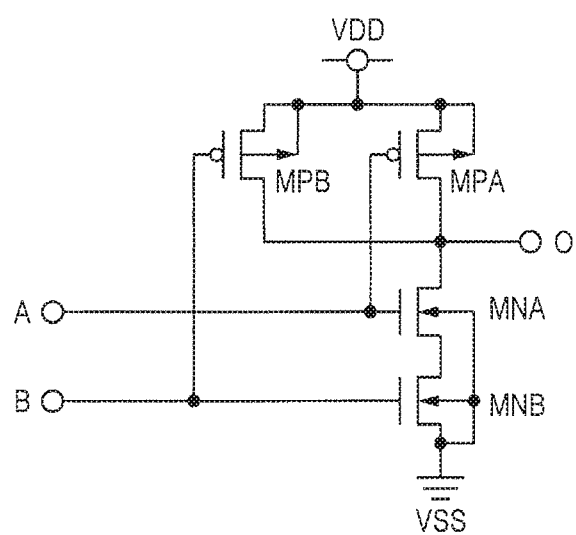
FIG. 7 is a concrete configuration example of a NAND circuit with two inputs in FIG. 4.

A first example (Embodiment Example 1) of a more concrete configuration of the ring oscillator pertaining to an embodiment is described with FIGS. 4 through 7. FIG. 4 is a circuit diagram depicting a first example of the ring oscillator in FIG. 2. FIG. 5 is a concrete configuration example of a NAND circuit with four inputs in FIG. 4. FIG. 6 is a concrete configuration example of a NOR circuit with three inputs in FIG. 4. FIG. 7 is a concrete configuration example of a NAND circuit with two inputs in FIG. 4.

A ring oscillator 11 in FIG. 4 is the one in which each of the gate circuits G1, G3, G5 in odd numbered stages of the ring oscillator 11 in FIG. 2 is configured as a NAND circuit and each of the gate circuits G2, G4, G6 in even numbered stages is configured as an NOR circuit. The drive power of each of the gate circuits G2, G4, G6 in even numbered stages is set larger than the drive power of each of the gate circuits G1, G3, G5 in odd numbered stages. The drive power of the gate circuit G7 is as much as the drive power of each of the gate circuits G1, G3, G5 in odd numbered stages.

More specifically, the ring oscillator 11 includes an input terminal. T1, NAND circuits G1, G3, G5, G7, NOR circuits G2, G4, G6, and, an output terminal T2. Each of the NAND circuits G1, G3, G5 has four inputs, each of the NOR circuits G2, G4, G has three inputs, and the NAND circuit, G7 has two inputs. One input terminal A of each of the NOR circuits G2, G4, G6 is coupled to an output terminal O of the NAND circuits G1, G3, G5 in the preceding stage. One input terminal A of the NAND circuit G7 is coupled to an output terminal O of the NOR circuit G6. An input terminal A of the NAND circuit G1 is coupled to an output terminal O of the NAND circuit 7. In this way, the ring oscillator is configured into a ring form as a whole.

Besides, the other input terminal B of the NAND circuit G7 is coupled to the input, terminal T1 and input terminals B through D of each of the other NAND circuits G1, G3, G5 are coupled to the input terminal A of itself respectively. Input terminals B through D of each of the NOR circuit, G2, G4, G6 are coupled to the input terminal A of itself respectively. The output terminal T2 from which an oscillation output is extracted is coupled to the output terminal O of the NOR circuit G6. Each of the NAND circuits G1, G3, G5 and the NOR circuits G2, G4 G6 functions as an inverter.

As depicted in FIG. 5, each of the NAND circuits G1, G3, G5 has a section in which PMOS transistors MPA, MPB, MPC, MPD are coupled in parallel and a section in which NMOS transistors MNA, MNB, MNC, MND are coupled in series, these sections being coupled in series, and the coupling points are coupled to an output terminal O. One end (source) of each of the PMOS transistors MPA, MPB, MPC, MPD is coupled to a power supply (high reference potential VDD) and one end (source) of an NMOS transistor MND is coupled to ground (low reference potential VSS). Besides, the gates of a PMOS transistor MPA and an NMOS transistor MNA are coupled to an input terminal A and the gates of a PMOS transistor MPB and an NMOS transistor MNB are coupled to an input terminal B. Also, the gates of a PMOS transistor MPC and an NMOS transistor MNC are coupled to an input terminal C and the gates of a PMOS transistor MPD and an NMOS transistor MND are coupled to an input terminal D. And now, because identical input signals are input to the input terminals A through D, the number of the PMOS transistors may differ from the number of the NMOS transistors.

As depicted in FIG. 6, each of the NOR circuits G2, G4, G6 has a section in which PMOS transistors MPA, MPB, MPC are coupled in series and a section in which NMOS transistors MNA, MNB, MNC are coupled in parallel, these sections being coupled in series, and the coupling points are coupled to an output terminal O. One end (source) of a PMOS transistor MPA is coupled to a power supply (VDD) and one end (source) of each of the NMOS transistors MNA, MNB, MNC, MND is coupled to ground (VSS). Besides, the gates of a PMOS transistor MPA and an NMOS transistor MNA are couplet to an input terminal A, the gates of a PMOS transistor MPB and an NMOS transistor MNB are coupled to an input terminal B, and the gates of a PMOS transistor MPC and an NMOS transistor MNC are coupled to an input terminal C. W/L of each of the PMOS transistors MPA, MPB, MPC in each of the NOR circuits G2, G4, G6 is larger than W/L of each of the PMOS transistors MPA, MPB, MPC, MPD in each of the NAND circuits G1, G3, G5. W/L of each of the NMOS transistors MNA, MNB, MNC in each of the NOR circuits G2, G4, G6 is larger than W/L of each of the NMOS transistors MNA, MNB, MNC, MND in each of the NAND circuits G1, G3, G5. And now, because identical input signals are input to the input terminals A through C, the number of the PMOS transistors may differ from the number of the NMOS transistors.

As depicted in FIG. 7, the NAND circuit G7 has a section in which PMOS transistors MPA, MPB are coupled in parallel and a section in which NMOS transistors MNA, MNB are coupled in series, these sections being coupled in series, and the coupling points are coupled to an output terminal O. One ends (source) of the PMOS transistors MPA, MPB are coupled to a power supply (VDD) and one end (source) of an NMOS transistor MNB is coupled to ground (VSS). Besides, the gates of a PMOS transistor MPA and an NMOS transistor MNA are coupled to an input terminal A and the gates of a PMOS transistor MPB and an NMOS transistor MNB are coupled to an input terminal B.

And now, the number of input signal lines of the NAND circuits and NOR circuits constituting the ring oscillator only needs to be two or more and, obviously, that number is non-limiting.

Figure 8:
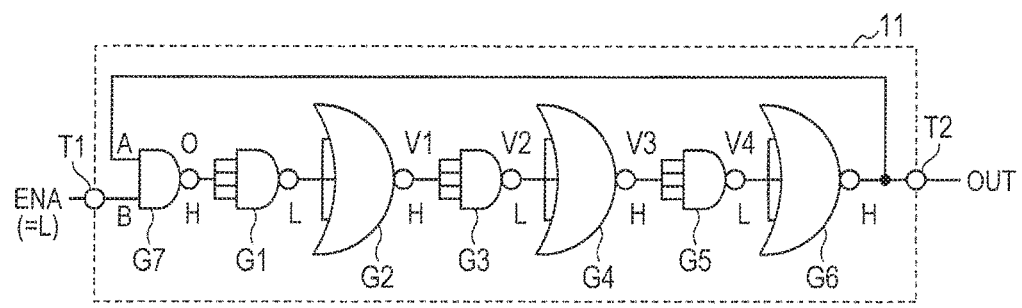
FIG. 8 is a circuit diagram for explaining operation of the ring oscillator in FIG. 4, when not oscillating.
Figure 9:
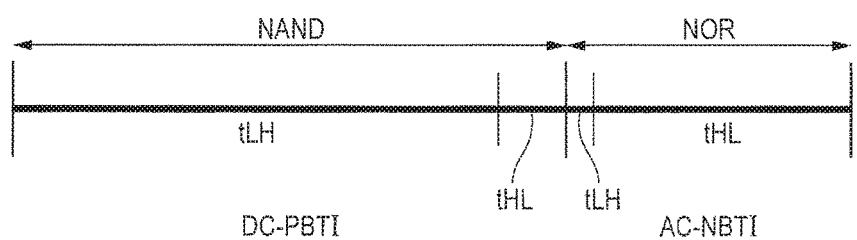
FIG. 9 is a diagram for explaining one example of a delay ratio of the ring oscillator in FIG. 4.

Operation of the ring oscillator, when not oscillating, is described with FIGS. 8 and 9. FIG. 8 is a circuit diagram for explaining operation of the ring oscillator in FIG. 4, when not oscillating. FIG. 9 is a diagram for explaining one example of a delay ratio of the ring oscillator in FIG. 4.

As depicted in FIG. 8, when an oscillation control signal (ENA) of low (L) state is given to an input terminal T1, L is input to an input terminal B of a NAND circuit G7 and the value of its output terminal O becomes H, regardless of whether high (H) or low is an input to the other input terminal. A. Because the output of each of subsequent gate circuits G1 through G6 is obtained by inverting the input to each circuit, these circuits output a sequence of L, H, L, H, L, H and a gate circuit (NOR circuit) G6 in a final stage outputs H. The H output of the NOR circuit G6 is input to the input terminal A of the NAND circuit. G7, but the output of the NAND circuit G7 is H as is. Therefore, the ring oscillator, when not oscillating, is stable with the L and H values marked in the diagram being maintained.

Because the drive power of the NOR circuits G2, G4, G6 is larger than the drive power of the NAND circuits G1, G3, G5, each of the NAND circuits G1, G3, G5 has a larger delay ratio than each of the NOR circuits G2, G4, and G6, as represented in FIG. 9.

Additionally, because, in each of the NAND circuits G1, G3, G5, the NMOS transistors MNA, MNB, MNC, MND are coupled in series, a rising input signal delay time (tLH) is larger than a falling input signal delay time (tHL), as represented in FIG. 9. Here, the rising input signal delay time (tLH) is a propagation delay time from the rising change of an input single (the input changes from L to H) until the falling change of an output signal (the output signal changes from to L). The falling input signal delay time (tHL) is a propagation delay time from the falling change of an input single (the input signal changes from H to L) until the rising change of an output signal (the output signal changes from L to H).

Besides, because, in each of the NOR circuits G2, G4, G6, the PMOS transistors MPA, MPH, MPC are coupled in series, the falling input signal delay time (tHL) is larger than the rising input delay time (tLH), as represented in FIG. 9.

In the ring oscillator 11, when not oscillating, in FIG. 8, MOS transistors which experience degradation are as below.

In the NAND circuit G7, because H is input to the input terminal A and L is input to the input terminal B, MOS transistors to which a gate voltage is applied to make a transistor active are an NMOS transistor MNA and a PMOS transistor MPB. Therefore, the NMOS transistor MNA experiences PBTI degradation and the PMOS transistor MPB experiences NBTI degradation.

In the NAND circuit G1 and subsequent stages, the NAND circuit G1 and others in odd numbered stages for which H is input to the input terminals A, B, C, D and the NOR circuit G2 and others in odd numbered stages for which L is input to the input terminals A, B, C, D are concatenated alternately. In the NAND circuit G1 and others for which H is input to the input terminals A, B, C, D, MOS transistors to which a gate voltage is applied to make a transistor active are NMOS transistors MNA, MNB, MNC, MND. Therefore, these NMOS transistors experience PBTI degradation. In the NOR circuit G2 and others for which L is input to the input terminals A, B, C, MOS transistors to which a gate voltage is applied to make a transistor active are PMOS transistors MBA, PMB, MPC. Therefore, these PMOS transistors experience NBTI degradation.

As depicted in FIG. 9, tLH of the NAND circuits G1, G3, G5 in odd numbered stages indicates the largest delay ratio. At this time, in each of the NAND circuits G1, G3, G5 in odd numbered stages, a voltage of H is applied to the gate of each of the NMOS transistors MNA, MNB, MNC, MND and, therefore, these transistors experience PBTI degradation, Hence, when the transistors experience PBTI degradation, the delay ratio is largest and, accordingly, sensitivity to PBTI degradation augments.

Figure 10:
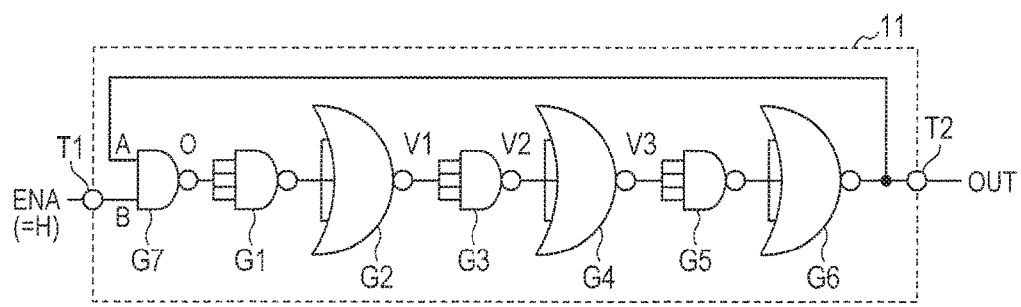
FIG. 10 is a circuit diagram for explaining operation of the ring oscillator in FIG. 4, when oscillating.
Figure 11:
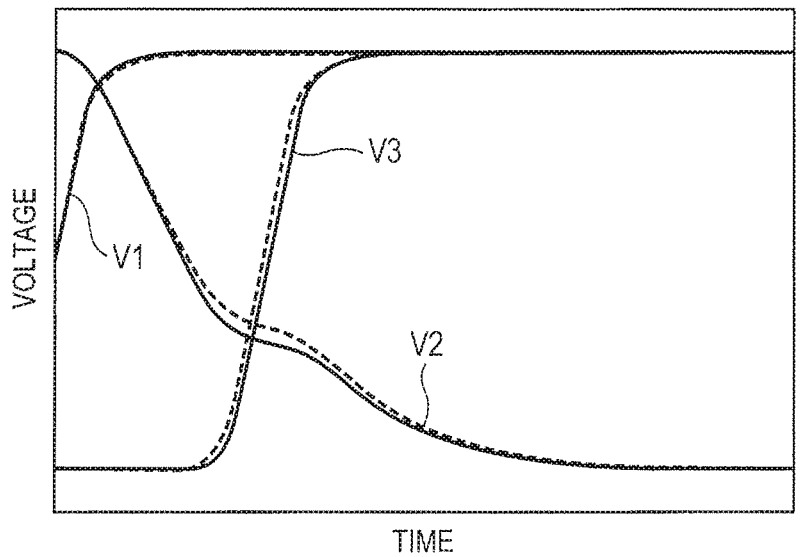
FIG. 11 is a waveform diagram for explaining operation of the ring oscillator in FIG. 4, when oscillating.
Figure 12:
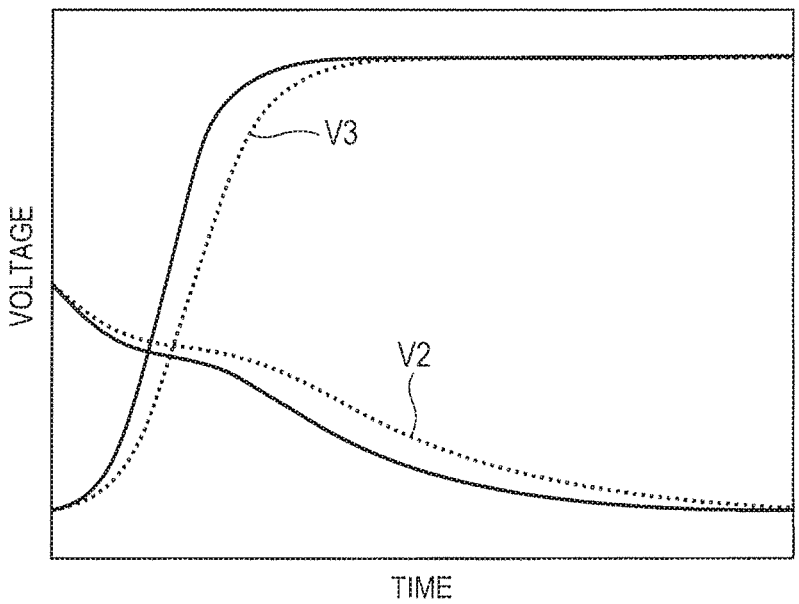
FIG. 12 is a waveform diagram for explaining operation of the ring oscillator in FIG. 4, when oscillating.
Figure 13:
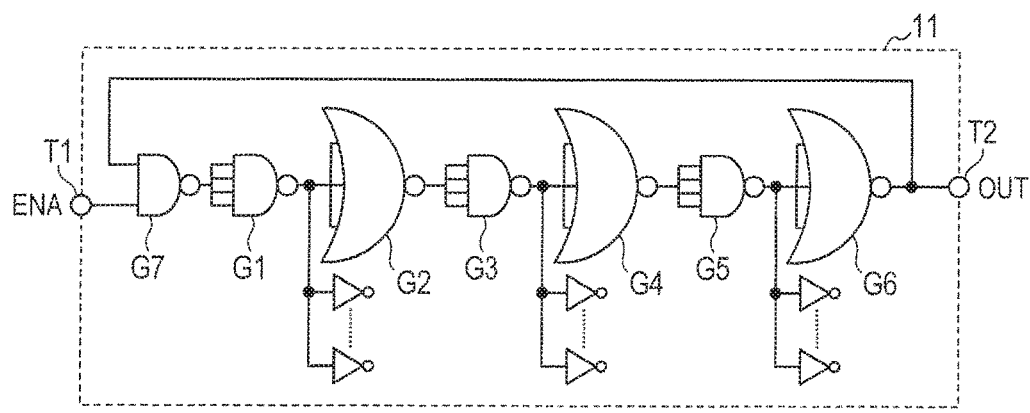
FIG. 13 is a circuit diagram depicting a modification example of the ring oscillator in FIG. 4.

Operation of the ring oscillator, when oscillating, is described with. FIG. 9 through 12. FIG. 10 is a circuit diagram for explaining operation of the ring oscillator in FIG. 4, when oscillating. FIG. 11 is a waveform diagram for explaining operation of the ring oscillator in FIG. 4, when oscillating. FIG. 12 is a waveform diagram for explaining operation of the ring oscillator in FIG. 4, when oscillating. FIG. 13 is a circuit diagram depicting a modification example of the ring oscillator in FIG. 4.

As depicted in FIG. 10, when the state of an oscillation control signal (ENA) which is input to the input terminal T1 is changed to H, both the input terminals A and B of the NAND circuit G7 become H, so the NAND circuit G7 outputs a value of L. Because the output of each of subsequent gate circuits G1 through G6 is obtained by inverting the input to each circuit, these circuits output a sequence of H, L, H, L, H, L and a gate circuit (NOR circuit) G6 in the final stage outputs L.

When the L output is input to the input terminal A of the NAND circuit G7, its output changes to H, since the value of the other input terminal B is H as is. Therefore, the outputs of the subsequent stages are a sequence of L, H, L, H, L, H obtained by inverting the input to each stage and the output of the gate circuit (NOR circuit) G6 in the final stage changes to H.

That is, when the ring oscillator is put in an oscillating state, a logic signal is propagated through the stages serially, while being inverted by each stage. Because there are odd numbered stages of gate circuits in total, an output that is obtained when the signal has passed through the ring-form stages once and returned is the inverse to the previous one. Therefore, the outputs of subsequent stages of gate circuits are also inverted serially and, eventually, the output of each stage repeats changing to H or L alternately, while the ring oscillator is placed in the oscillating state. The thus obtained output is extracted from the output terminal T2.

MOS transistors engaged in oscillation are those that repeat turning on and of with change of their gate voltage when the ring oscillator is oscillating. Such MOS transistors are supplied with a gate voltage from the input terminal A. Thus, those transistors are as follows: a PMOS transistor MPA and an NMOS transistor MNA in the first NAND circuit G7; all of PMOS transistors MPA, MPB, MPC, MPD and NMOS transistors MNA, MNB, MNC, MND in each of the NAND circuits G1, G3, G5 in which the input terminals A, B, C, D are coupled together; and all of the PMOS transistors MPA, MPB, MPC and NMOS transistors MNA, MNB, MNC in each of the NOR circuits G2, G4, G6 in which the input terminals A, B, C are coupled together.

As depicted in FIG. 9, a falling input signal propagation delay (thL) that is influenced by NBTI degradation is larger for NOR circuits than for NAND circuits and predominant on NOR circuits. Also, an input waveform (V2) of NOR circuits is influenced by a mirror effect.

As the drive power of each of the PMOS transistors MPA, MPB, MPC in NOR circuits decreases because of NBTI degradation and the logic threshold value of the NOR circuits falls, the level of potential at which the mirror effect of V2 occurs falls, as represented in FIG. 11. In FIG. 11, a dashed line denotes a voltage transition before NBTI degradation and solid line denotes a voltage transition after NBTI degradation. Rising of the output signal (V3) of the NOR circuits occurs when a mirror capacitance is charged. During the rising transition of V3, a gate-to-source voltage (Vgs) of each of the PMOS transistors MPA, MPB, MPC in the NOR circuits increases after NBTI degradation, due to the fall of the level of potential at which the mirror effect occurs. Thus, the drive power of each of the PMOS transistors MPA, MPB, MPC increases during the transition of V3, which compensates the degradation of each of the PMOS transistors MPA, MPB, MPC due to NBTI and reduces a frequency degradation, i.e., frequency decreases because of a delay.

In the case of PBTI degradation, each of the NMOS transistors MNA, MNB, MNC in NAND circuits degrades, when the ring oscillator is not oscillating. This causes an increase in the transition time (time for transition from H to L) of a falling output signal (V2) of the NAND circuits, as represented in FIG. 12. In FIG. 12, a dashed line denotes a voltage transition after PBTI degradation and a solid line denotes a voltage transition before PBTI degradation. Generally, when the transition time of an input signal to a logic circuit increases, the propagation delay also increases. Then, looking at operation of the NOR circuits in the ring oscillator 11, their input signal is at an intermediate potential during the rising (V3) transition of the output signal of the NOR circuits due to the influence of the mirror effect. The smaller the gate-to-source voltage (Vgs) of each of the NMOS transistors MNA, MNB, MNC in the NOR circuits, the influence of voltage variation increases, which accordingly increases the sensitivity to an increase in the propagation delay in p portion to an increase in the transition time of the input signal. Therefore, in the ring oscillator 11, there is a large increase in the propagation delay of the falling input signal of the NOR circuits and the frequency degradation due to PBTI is amplified.

As an aging degradation of transistors, Hot Carrier Injection (HCI) is also of a concern. HCI degradation increases when an output waveform of a gate circuit is sluggish; it occurs when a falling signal is input to NAND circuits or a falling signal is input to NOR circuits in the present embodiment example. At this time, however, because of driving of each of the NMOS transistors MNA, MNB, MNC, MND which are coupled longitudinally in series in the NAND circuits and each of the PMOS transistors MPA, MPB, MPC which are coupled longitudinally in series in the NOR circuits, their source-to-drain voltage is mitigated by the effect of coupling them longitudinally in series and the HCI degradation is suppressed.

Gate circuits such as inverters for fan-out loads may be added to an output node of each of the NOR circuits G2, G4, G6, as depicted in FIG. 13. It is possible to adjust the delay ratio of the NAND circuits and the NOR circuits by increasing or decreasing the number of fan-outs, thereby increasing or decreasing the delay of the NOR circuits.

Embodiment Example 2

Figure 14:
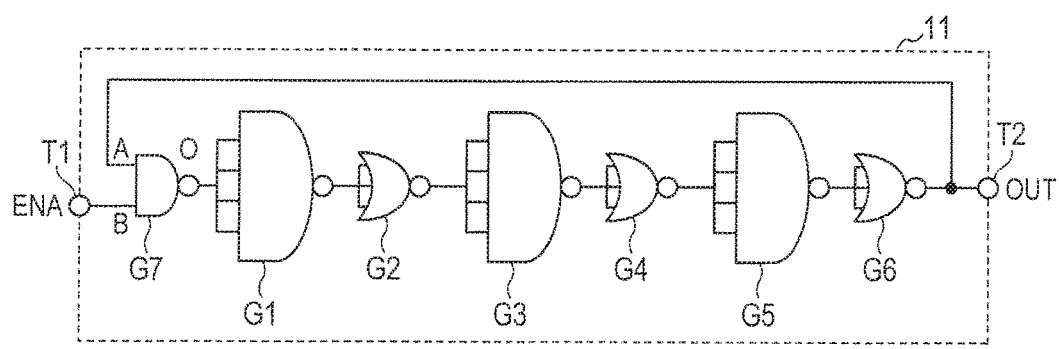
FIG. 14 is a circuit diagram depicting another example of the ring oscillator in FIG. 2.
Figure 15:
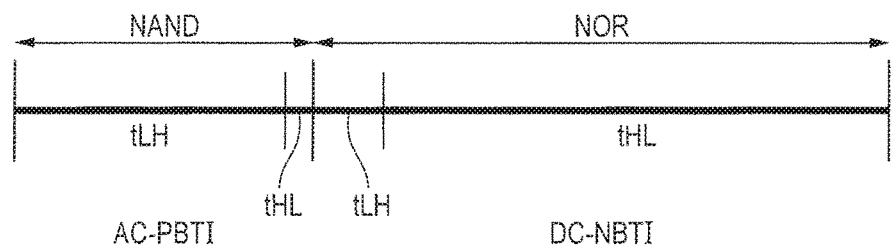
FIG. 15 is a diagram for explaining one example of a delay ratio of the ring oscillator in FIG. 14.

A second example (Embodiment Example 2) of a more concrete configuration of the ring oscillator pertaining to an embodiment is described with FIGS. 5 through 7 and FIGS. 14 and 15. FIG. 14 is a circuit diagram depicting a second example of the ring oscillator in FIG. 2. FIG. 15 is a diagram for explaining one example of a delay ratio of the ring oscillator in FIG. 14.

A ring oscillator 11 in FIG. 14 is the one in which each of the gate circuits G1, G3, G5 in odd numbered stages of the ring oscillator 11 in FIG. 2 is configured as a NAND circuit and each of the gate circuits G2, G4, G6 in even numbered stages is configured as an NOR circuit, as is the case for the ring oscillator 11 in FIG. 4. Unlike the ring oscillator 11 in FIG. 4, however, in the ring oscillator 11 in FIG. 14, the drive power of each of the NAND circuits G1, G3, G5 in odd numbered stages is set larger than the drive power of each of the NOR circuits G2, G4, G6 in even numbered stages. The drive power of the gate circuit G7 is as much as the drive power of each of the NOR circuits G2, G4, G6 in even numbered stages, W/L of each of the PMOS transistors MPA, MPB, MPC, MPD in each of the NAND circuits G1, G3, G5 is larger than W/L of each of the PMOS transistors MPA, MPB, MPC in each of the NOR circuits G2, G4, G6. W/L of each of the NMOS transistors MNA, MNB, MNC, MND in each of the NAND circuits G1, G3, G5 is larger than W/L of each of the NMOS transistors MNA, MNB, MNC in each of the NOR circuits G2, G4, G6.

Because the drive power of each of the NAND circuits G1, G3, G5 is larger than the drive power of each of the NOR circuits G2, G4, G6, each of the NOR circuits G2, G4, G6 has a larger delay ratio than each of the NAND circuits G1, G3, G5, as represented in FIG. 15.

Additionally, because, in each of the NAND circuits G1, G3, G5, the NMOS transistors MNA, MNB, MNC, MND are coupled in series, a rising input signal delay time (tLH) is larger than a falling input signal delay time (tHL), as represented in FIG. 15.

Besides, because, in each of the NOR circuits G2, G4, G6, the PMOS transistors MPA, MPB, MPC are coupled in series, the falling input signal delay time (tHL) is larger than the rising input delay time (tLH), as represented in FIG. 15.

As represented in FIG. 15, tHL of each of the NOR circuits G2, G4, G6 in even numbered stages indicates the largest delay ratio. When the ring oscillator is not oscillating, in each of the NOR circuits G2, G4, G6 in even numbered stages, a voltage of L is applied to the gate of each of the PMOS transistors MPA, MPB, MPC and, therefore, these transistors experience NBTI degradation. Hence, when the transistors experience NBTI degradation, the delay ratio is largest and, accordingly, sensitivity to NBTI degradation augments.

As represented in FIG. 15, a falling input signal propagation delay (tLH) that is influenced by PBTI degradation is larger for NAND circuits than for NOE circuits and predominant on NAND circuits.

As the drive power of each of the NMOS transistors MNA, MNB, MNC, MND in NAND circuits decreases because of PBTI degradation and the logic threshold value of the NAND circuits rises, the level of potential at which the mirror effect of rising of the input signal of the NAND circuits occurs rises. Falling of the output signal of the NAND circuits occurs when a mirror capacitance is charged. During the falling transition of the output signal of the NAND circuits, a gate-to-source voltage (Vgs) of each of the NMOS transistors MNA, MNB, MNC, MND in the NAND circuits increases after PBTI degradation, due to the rise of the level of potential at which the mirror effect occurs. Thus, the drive power of each of the NMOS transistors MNA, MNB, MNC, MND increases during the falling transition of the output signal of the NAND circuits, which compensates the degradation of each of the NMOS transistors MNA, MNB, MNC, MND in the NAND circuits due to PBTI and reduces a frequency degradation, i.e., frequency decreases because of a delay.

Comparison Example

Figure 16:
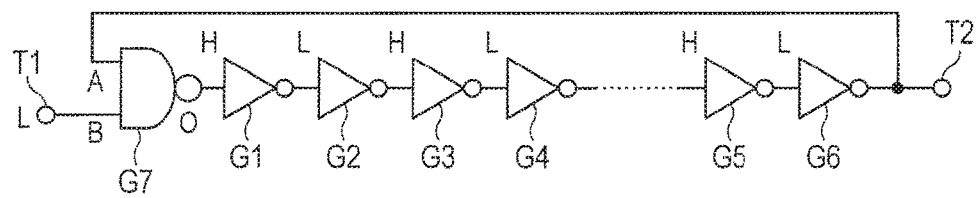
FIG. 16 is a circuit diagram for explaining operation of a ring oscillator pertaining to a comparison example, when not oscillating.
Figure 17:
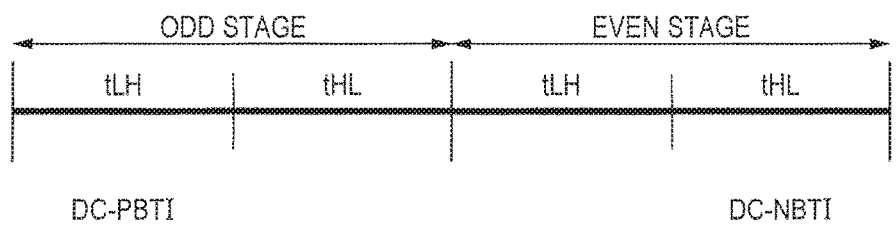
FIG. 17 is a diagram for explaining a delay ratio of the ring oscillator in FIG. 16.
Figure 18:
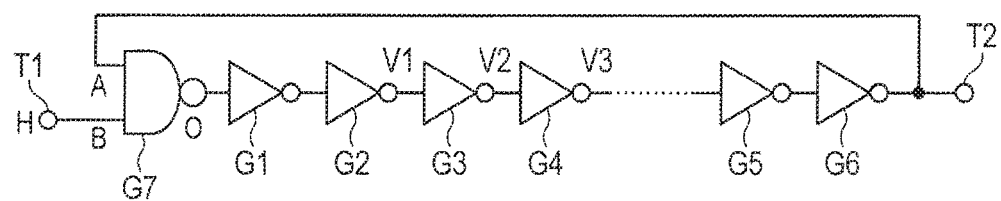
FIG. 18 is a circuit diagram for explaining operation of the ring oscillator pertaining to the comparison example, when oscillating.
Figure 19:
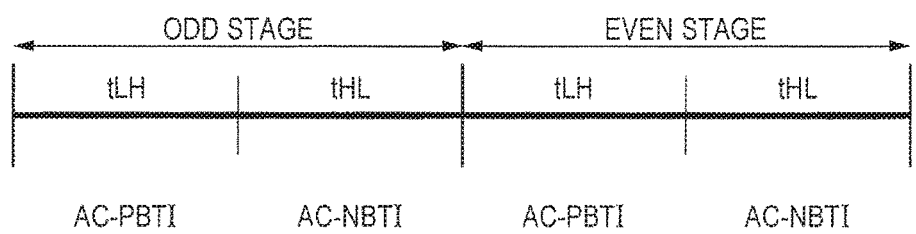
FIG. 19 is a diagram for explaining a delay ratio of the ring oscillator in FIG. 18.
Figure 20:
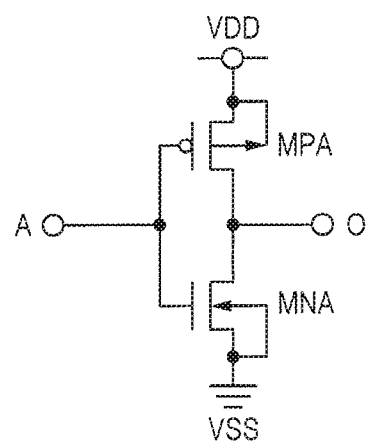
FIG. 20 is a concrete configuration of an inverter in the ring oscillator pertaining to the comparison example.
Figure 21:
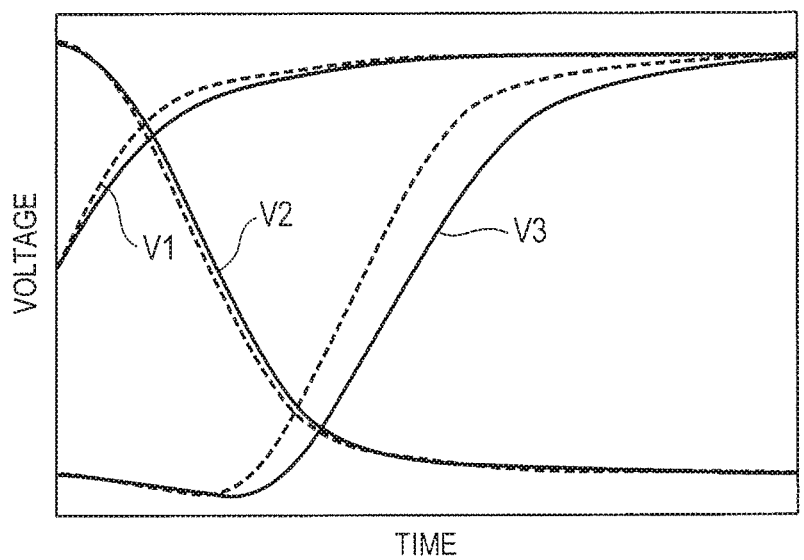
FIG. 21 is a waveform diagram for explaining operation of the ring oscillator in FIG. 18, when oscillating.

A ring oscillator pertaining to a technology (a comparison example) examined by the present inventors prior to the present disclosure is described with reference to FIGS. 16 through 21 FIG. 16 is a circuit diagram for explaining operation of the ring oscillator pertaining to the comparison example, when not oscillating. FIG. 17 is a diagram for explaining a delay ratio of the ring oscillator in FIG. 16. FIG. 18 is a circuit diagram for explaining operation of the ring oscillator pertaining to the comparison example, when oscillating. FIG. 19 is a diagram for explaining a delay ratio of the ring oscillator in FIG. 18. FIG. 20 is a concrete configuration of an inverter in the ring oscillator pertaining to the comparison example. FIG. 21 is a waveform diagram for explaining operation of the ring oscillator in FIG. 18, when oscillating.

The ring oscillator pertaining to the comparison example is the one in which each of the gate circuits G1 through G6 of the ring oscillator 11 in FIG. 2 is configured as an inverter and the gate circuit G7 is configured as a NAND circuit. The gate circuits G1 through G6 each have equal drive power. In each circuit of the inverters G1 through G6, the W/L of a PMOS transistor MPA is equal and the W/L of an NMOS transistor MNA is also equal.

As depicted in FIG. 16, when an oscillation control signal (ENA) of L state is given to an input terminal T1, L is input to an input terminal B of a NAND circuit G7 and the value of its output terminal O becomes H, regardless of whether H or L is an input to the other input terminal A. Because the output of each of subsequent gate circuits (inverters) G1 through G6 is obtained by inverting the input to each circuit, these circuits output a sequence of L, H, L, H, L, H and a gate circuit (inverter) G6 in a final stage outputs H. The H output of the inverter G6 is input to the input terminal A of the NAND circuit G7, but the output of the NAND circuit G7 is H as is. Therefore, the ring oscillator, when not oscillating, is stable with the L and H values marked in the diagram being maintained.

Because the driver power of the respective circuits of the inverters G1 through G6 is equal, inverters G2, G4, G6 in even numbered stages and inverters G1, G3, G5 in even numbered stages each have an equal delay ratio, as depicted in FIG. 17.

Also, because a single stage of a PMOS transistor and a single stage of a NMOS transistor MNA are present in each of the inverters G1 through G6, a rising input signal delay time (tLH) and a falling input signal delay time (tHL) are equal, as depicted in FIG. 17.

The delay ratio in terms of tLH and tHL is substantially equal for the inverters in each stage, as depicted in FIG. 17. When the ring oscillator is not oscillating, in each of the inverters G2, G4, G6 in even numbered stages, a voltage of L is applied to the gate of the PMOS transistor MPA and, therefore, this transistor experiences NBTI degradation. Hence, when the transistor experiences NBTI degradation, the delay ratio is only one-fourth of a total delay (influence of NBTI degradation is only one-fourth) and, accordingly, sensitivity to NBTI degradation is smaller than that of the ring oscillator in FIG. 4. In each of the inverters G1, G3, G5 in odd numbered stages, a voltage of H is applied to the gate of the NMOS transistor MNA and, therefore, this transistor experiences PBTI degradation. Hence, when the transistor experiences PBTI degradation, the delay ratio is only one-fourth of a total delay (influence of PBTI degradation is only one-fourth) and, accordingly, sensitivity to PBTI degradation is smaller than that of the ring oscillator in FIG. 14.

As depicted in FIG. 18, when the state of an oscillation control signal (ENA) which is input to the input terminal T1 is changed to H, both the input terminals A and B of the NAND circuit G7 become H, so the NAND circuit G7 outputs a value of L. Because the output of each of subsequent gate circuits G1 through G6 is obtained by inverting the input to each circuit, these circuits output a sequence of H, L, H, L, H, L and a gate circuit (inverter) G6 in the final stage outputs L.

When the L output is input to the in terminal A of the NAND circuit G7, its output chances to H, since the value of the other input terminal B is H as is. Therefore, the outputs of the subsequent stages are a sequence, of L, H, L, H, L, H obtained by inverting the input to each stage and the output of the gate circuit (inverter) G6 in the final stage changes to H.

That is, when the ring oscillator is put in an oscillating state, a logic signal is propagated through the stages serially, while being inverted by each stage. Because there are odd numbered stages of gate circuits in total, an output that is obtained when the signal has passed through the ring-form stages once and returned is the inverse to the previous one. Therefore, the outputs subsequent stages of gate circuits are also inverted serially and, eventually, the output of each stage repeats changing to H or L alternately, while the ring oscillator is placed in the oscillating state. The thus obtained output is extracted from the output terminal T2.

MOS transistors engaged in oscillation are those that repeat turning on and off with change of their gate voltage when the ring oscillator is oscillating. Such MOS transistors are supplied with a gate voltage from the input terminal A. Thus, those transistors are as follows: the PMOS transistor MPA and the NMOS transistor MNA in the first NAND circuit G7 and all the PMOS transistors MPA and the NMOS transistors DANA in the respective inverters G1 through G6 to which the input terminal A is coupled.

As represented in FIG. 19, a falling input signal propagation delay (tHL) that is influenced by NBTI degradation is nearly equal for the inverters in odd numbered stages and the inverters in even numbered stages and it is nearly one-half of a delay ratio. Sensitivity to NBTI degradation is larger than that of the ring oscillator in FIG. 4. A rising input signal propagation delay (tLH) that is influenced by PBTI degradation is nearly equal for the inverters in odd numbered stages and the inverters in even numbered stages and it is nearly one-half of a delay ratio. Sensitivity to PBTI degradation is larger than that of the ring oscillator in FIG. 14. Because gate circuits are inevitably influenced by NBTI degradation and PBTI degradation during oscillating operation, it is unable to suppress degradation when the ring oscillator is always oscillating. For instance, an output signal (V3) of a gate circuit G4 is delayed by NBTI degradation, as represented in FIG. 21. In FIG. 21, a dashed line denotes a voltage transition before NBTI degradation and a solid line denotes a voltage transition after NBTI degradation.

Figure 22:
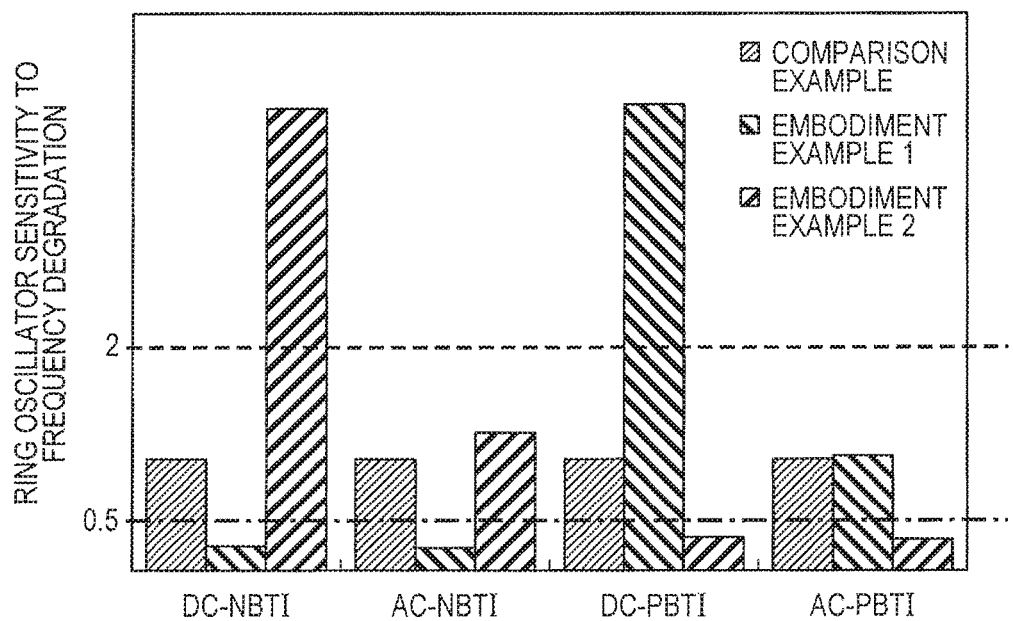
FIG. 22 is a diagram representing ring oscillator sensitivity to frequency degradation.
Figure 23:
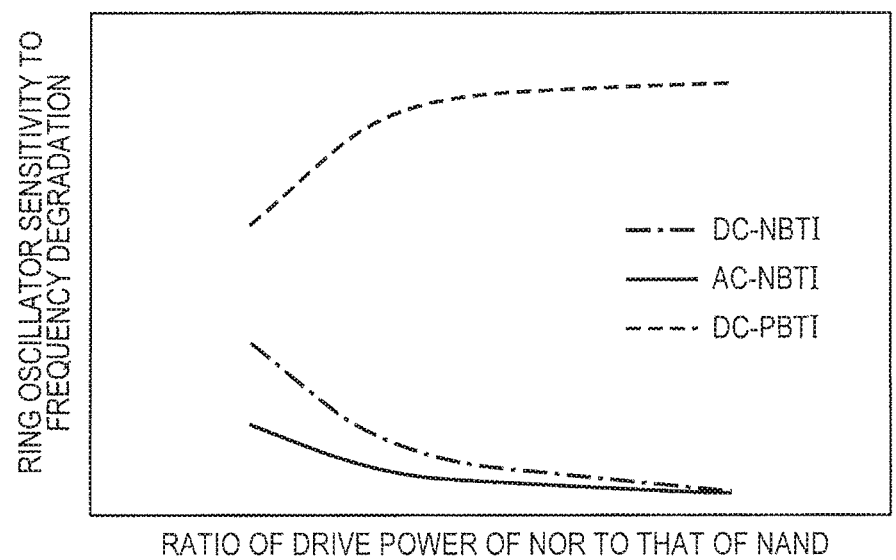
FIG. 23 is a diagram representing a relation between sensitivity to frequency degradation and a drive power ratio of the ring oscillator in FIG. 4.

Advantageous effects of the ring oscillator pertaining to an embodiment are described with FIGS. 22 and 23. FIG. 22 is a diagram representing ring oscillator sensitivity to frequency degradation. FIG. 23 is a diagram representing a relation between sensitivity to frequency degradation and a drive power ratio of the ring oscillator in FIG. 4.

In FIG. 22, the sensitivities of ring oscillators are each normalized with respect to the sensitivity of the ring oscillator of Comparison Example and represented in bar graphs which are of Comparison Example, Embodiment Example 1, and Embodiment Example 2 in order starting from the left. DC-NBTI means frequency degradation attributed to NBTI experienced by each ring oscillator in a non-oscillating state. AC-NBTI means frequency degradation attributed to NBTI experienced by each ring oscillator in an oscillating state. DC-PBTI means frequency degradation attributed to PBTI experienced by each ring oscillator in a non-oscillating state. AC-PBTI means frequency degradation attributed to PBTI experienced by each ring oscillator in an oscillating state.

As against the ring oscillator of Comparison Example, the ring oscillator of Embodiment Example 1 enables it to reduce the sensitivity to AC-NBTI and the sensitivity to DC-NBTI to a large extent. Also, the ring oscillator of Embodiment. Example 1 enables it to increase the sensitivity to DC-PBTI to a large extent.

As against the ring oscillator of Comparison Example, the ring oscillator of Embodiment Example 2 enables it to reduce the sensitivity to AC-PBTI and the sensitivity to DC-PBTI to a large extent. Also, the ring oscillator of Embodiment, Example 2 enables it to increase the sensitivity to DC-NBTI to a large extent.

As represented in FIG. 23, the larger the ratio of the drive power of NOR circuits to that of NAND circuits, lower will be the sensitivity to AC-NBTI and DC-NBTI and higher will be the sensitivity to DC-ˆPBTI. The ratio of the drive power of NOR circuits to that of NAND circuits is 2 at the left end of a curved line and B at the right end of a curved line. The ratio of the drive power of NOR circuits to that of NAND circuits is preferably 2 or more and, more preferably, 4 or more.

Application Example 1

Figure 24:
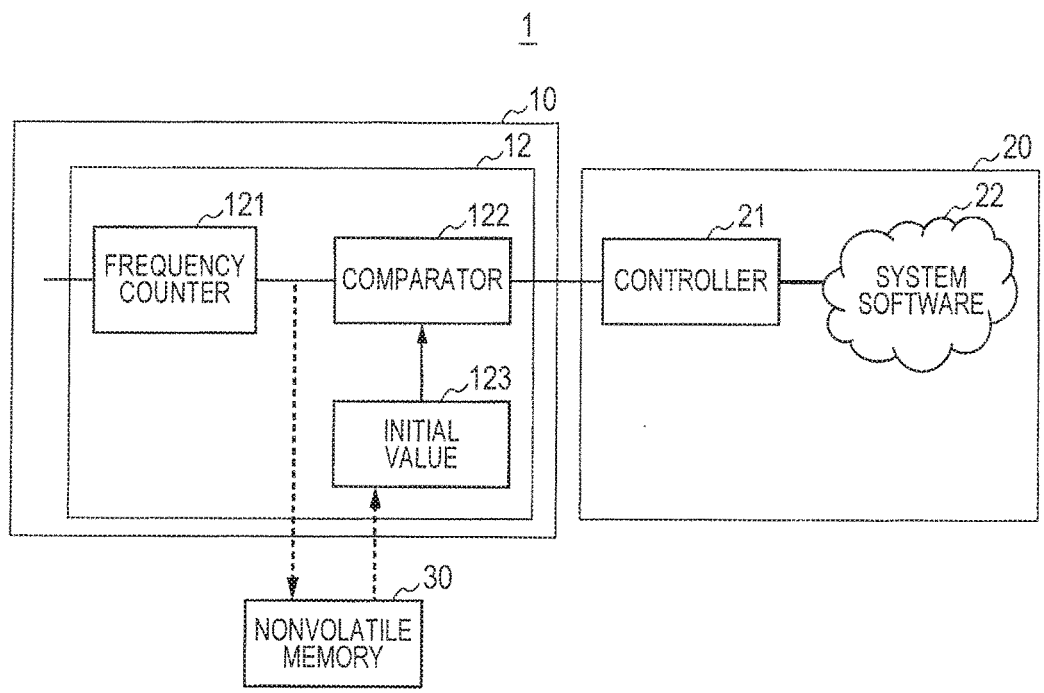
FIG. 24 is a block diagram depicting a delay detecting circuit and a control circuit pertaining to Application Example 1.
Figure 25:
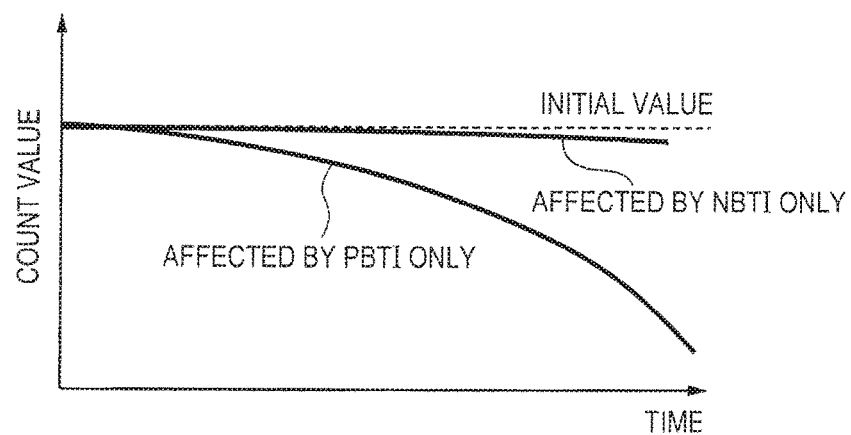
FIG. 25 is a diagram representing the frequency degradation of the ring oscillator in FIG. 4.

Application Example 1 using a monitoring circuit pertaining to an embodiment (the ring oscillator pertaining to Embodiment Example 1 or Embodiment Example 2) is described with FIGS. 24 and 25. FIG. 24 is a block diagram depicting a delay detecting circuit and a control circuit pertaining to Application Example 1. FIG. 25 is a diagram representing the frequency degradation of the ring oscillator in FIG. 4.

Application Example 1 is an instance in which, the monitoring circuit 10 is used as an aging degradation monitoring circuit (a circuit for detecting a decrease in reliability). The semiconductor device 1 is equipped with the monitoring circuit 10 and a control circuit 20 in one semiconductor chip (semiconductor substrate). The control circuit 20 may be provided in another semiconductor chip, separated from the monitoring circuit 10.

A count value of a frequency counter 121 of the ring oscillator 11 measured at a pre-shipment test of the semiconductor device 1 is stored in a nonvolatile memory 30 such as a flash memory. After power-on of the semiconductor device 1, the count value is loaded from the nonvolatile memory 30 and stored into a register 123 as an initial value. The nonvolatile memory 30 may be the same one as a nonvolatile memory in which a program for a CPU comprised in the semiconductor device 1 is stored. The register 123 may be configured using a nonvolatile memory. The initial value corresponds to an oscillation frequency of the ring oscillator 11 before experiencing stress. As represented in FIG. 25, as the frequency of the ring oscillator is degraded gradually over time, the count value of the frequency counter 121 decreases. Thus, when the count value of the frequency counter 121 has become mismatched with the initial value, a degradation can be detected. The ring oscillator 11 is put in a non-oscillating state and stress (PC-PBTI in Embodiment Example 1 or DC-NBTI in Embodiment Example 2) is applied (stress application). Then, the ring oscillator 11 is put in an oscillating state and the count value of the frequency counter 121 is compared with the initial value held in the register 123. Thereby, a quantity of PBTI degradation is detected in Embodiment Example 1 or a quantity of NBTI degradation is detected in Embodiment Example 2 at high sensitivity (delay detection). Information corresponding to a result of comparison with the initial value (PBTI degradation detection signal or NBTI degradation detection signal) is sent to a controller 21 and fed back to system software 22 which is stored in a memory within the control circuit 20. Stress application and delay detection may be performed at a certain interval by controlling an oscillation control signal (ENA) with a timer which is not depicted. The monitoring circuit 10 is equipped with either the ring oscillator in Embodiment Example 1 or the ring oscillator in Embodiment Example 2; however, it may be equipped with both ring oscillators in Embodiment Examples 1 and 2. In the latter case, a quantity of PBTI degradation and a quantity of NBTI degradation can be detected at high sensitivity.

Application Example 2

Figure 26:
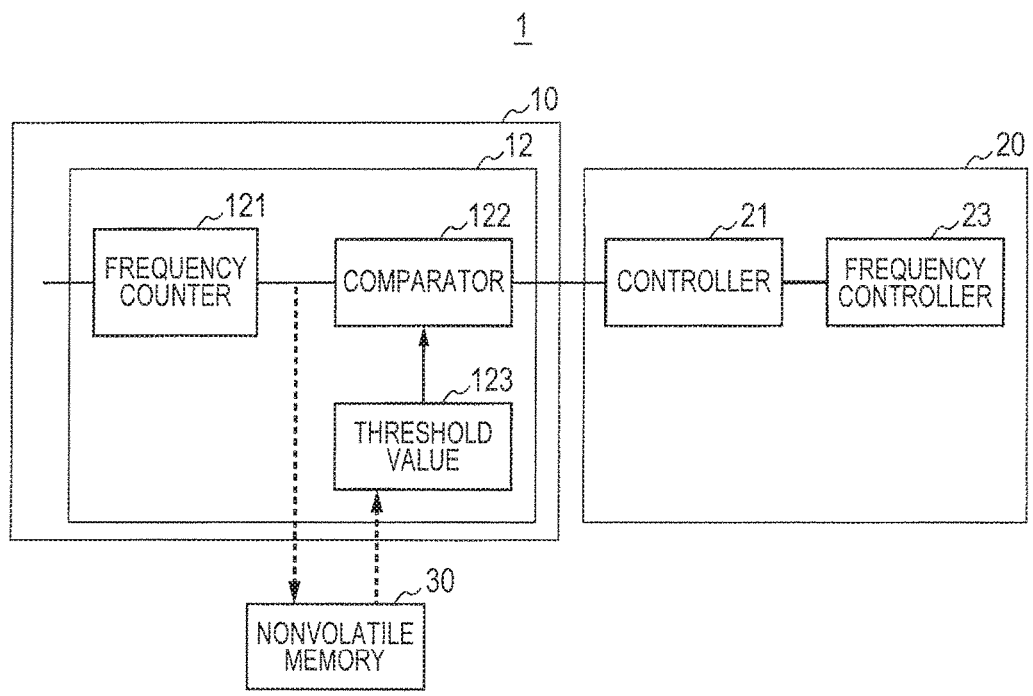
FIG. 26 is a block diagram depicting a delay detecting circuit and a control circuit pertaining to Application Example 2.
Figure 27:
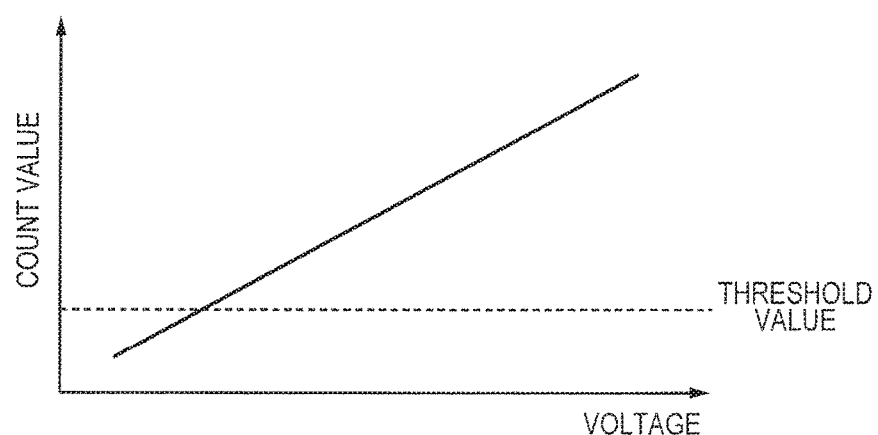
FIG. 27 is a diagram representing dependency of the frequency of the ring oscillator on voltage.

Application Example 2 using a monitoring circuit pertaining to an embodiment (the ring oscillator pertaining to Embodiment Example 1 or Embodiment Example 2) is described with FIGS. 26 and 27. FIG. 26 is a block diagram depicting a delay detecting circuit and a control circuit pertaining to Application Example 2. FIG. 27 is a diagram representing dependency of the frequency of the ring oscillator on voltage.

Application Example 2 is an instance in which the monitoring circuit 10 is used as a voltage detecting circuit (a circuit for detecting voltage depression). The semiconductor device 1 is equipped with the monitoring circuit 10 and a control circuit 20 in one semiconductor chip (semiconductor substrate). The control circuit 20 may be provided in another semiconductor chip, separated from the monitoring circuit 10.

A count value of a frequency counter 121 of the ring oscillator 11 measured at a pre-shipment test for low voltage of the semiconductor device 1 is stored in a nonvolatile memory 30. After power-on of the semiconductor device 1, the count value is loaded from the nonvolatile memory 30 and stored into a register 123 as a threshold value. The register 123 may be configured using a nonvolatile memory. The threshold value corresponds to an oscillation frequency of the ring oscillator 11 when operating at a predetermined lowest voltage. As represented in 27, as the voltage decreases, the frequency of the ring oscillator 11 decreases and the count value of the frequency counter 121 decreases. Thus, when the count value of the frequency counter 121 has become matched with the threshold value, voltage depression can be detected. The ring oscillator 11 is put in an oscillating state and stress (DC-PBTI in Embodiment Example 1 or DC-NBTI in Embodiment Example 2) is applied (stress application) Then, the ring oscillator 11 is put in an oscillating state and the count value of the frequency counter 121 is compared with the threshold value held in the register 123. Thereby, voltage drop is detected without being influenced by NBTI degradation in Embodiment Example 1 or PBTI degradation Embodiment Example 2. Information corresponding to a result of comparison with the threshold value is sent to a controller 21 and fed back to a frequency controller 23. Upon detecting voltage depression, for instance, the frequency controller 23 lowers the operating frequency of a CPU or the like comprised in the semiconductor device 1 to prevent malfunction of the semiconductor device 1.

While the invention made by the present inventors has been described specifically based on its embodiment, embodiment examples, comparison example, and application examples, it will be appreciated that the present invention is not limited to the described embodiment, embodiment examples, comparison example, and application examples and various modifications may be made thereto.

For instance, although an example was described in which gate circuits G1, G, G5, G7 in a ring oscillator are configured as NAND circuits and gate circuits G2, G4, G6 are configured as NOR circuits, the gate circuits G1, G3, G5, G7 may be configured as NOR circuits and the gate circuits G2, G4, G6 may be configured as NAND circuits.

Besides, although an example was described in which the gate circuits in a ring oscillator are configured as the NAND circuits and the NOR circuits; in an alternative configuration, the NAND circuits may be replaced by gate circuits in which the number of stages of PMOS transistors coupled in series between the high reference potential and the output is smaller than the number of stages of NMOS transistors coupled in series between the low reference potential and the output. Also, in an alternative configuration, the NOR circuits may be replaced by gate circuits in which the number of stages of PMOS transistors coupled in series between the high reference potential and the output is larger than the number of stages of NMOS transistors coupled in series between the low reference potential and the output. Also, in an alternative configuration, the NAND circuits may be replaced by gate circuits for which tHL is larger than tLH, in an alternative configuration, the NOR circuits may be replaced by gate circuits for which tHL is smaller than tLH.

Preferred Aspects

Preferred aspects are additionally described below.
(Appendix 1)
A semiconductor device comprises:
a ring oscillator; and
a delay detecting circuit which detects a delay through gate circuits based on the oscillation frequency of the ring oscillator.
The ring oscillator comprises:
an input terminal to which an oscillation control signal is input;
an output terminal which outputs an oscillation signal;
an oscillation control gate circuit having a first input terminal which is coupled to the input terminal and a second input terminal to which a terminal different from the input terminal is coupled;
first gate circuits; and
second gate circuits.
The first gate circuits each include PMOS transistors whose source is coupled to a first potential and NMOS transistors whose source is coupled to a second potential which is lower than the first potential.
The first gate circuits are those for which a rising input signal delay time from the rising change of an input single until the falling change of an output signal is larger than a falling input signal delay time from the falling change of an input single until the rising change of an output signal.
The second gate circuits each include PMOS transistors whose source is coupled to the first potential and NMOS transistors whose source is coupled to the second potential and are those for which the rising input signal delay time is smaller than the falling input signal delay time.
The first gate circuits and the second gate circuits are cascade coupled alternately.
Plural inputs of the first gate circuits are coupled together.
Plural inputs of the second gate circuits are coupled together.
A delay ratio of the first gate circuits differs from that of the second gate circuits.
(Appendix 2)
In the semiconductor device of Appendix 1, an output terminal the oscillation control gate circuit is coupled to an input terminal of one of the first gate circuits and the second input terminal is coupled to the second output terminal of one of the second gate circuits.
(Appendix 3)
In the semiconductor device of Appendix 2, an output terminal of the ring oscillator is coupled to any one of the output terminal of the oscillation control gate circuit, the first output terminal of one of the first gate circuits, and the second output terminal of one of the second gate circuits.

What is claimed is:
1. A semiconductor device comprising:
a ring oscillator; and
a delay detecting circuit which detects a delay through gate circuits based on an oscillation frequency of the ring oscillator,
wherein the delay detecting circuit comprises:
a counter which counts the oscillating frequency of the ring oscillator;
a comparator which compares a value of the counter with a reference value; and
a first register to store the reference value, and
wherein the reference value is a value based on the oscillation frequency of the ring oscillator at initial energization of the semiconductor device,
wherein the ring oscillator comprises:
an input terminal to which an oscillation control signal is input;
an output terminal which outputs an oscillation signal;
an oscillation control gate circuit having a first input terminal which is coupled to the input terminal and a second input terminal to which the output terminal outputting the oscillation signal is coupled;
NAND circuits; and
NOR circuits,
wherein the NAND circuits and the NOR circuits are cascade coupled alternately between an output terminal of the oscillation control gate circuit and the output terminal outputting the oscillation signal,
wherein a plurality of inputs of the NAND circuits are coupled together,
wherein a plurality of inputs of the NOR circuits are coupled together, and
wherein drive power of the NAND circuits differs from drive power of the NOR circuits.
2. The semiconductor device according to claim 1,
wherein the NAND circuits each include PMOS transistors whose source is coupled to a first potential and NMOS transistors whose source is coupled to a second potential which is lower than the first potential, and
wherein the NOR circuits each include PMOS transistors whose source is coupled to the first potential and NMOS transistors whose source is coupled to the second potential.
3. The semiconductor device according to claim 2,
wherein an output terminal of the oscillation control gate circuit is coupled to an input terminal of one of the NAND circuits and the second input terminal is coupled to an output terminal of one of the NOR circuits.
4. The semiconductor device according to claim 3,
wherein an output terminal of the ring oscillator is coupled to any one of an output terminal of one of the NAND circuits, and an output terminal of one of the NOR circuits.
5. The semiconductor device according to claim 1,
wherein drive power of the NOR circuits is larger than drive power of the NAND circuits.
6. The semiconductor device according to claim 1,
wherein drive power of the NAND circuits is larger than drive power of the NOR circuits.
7. The semiconductor device according to claim 5,
wherein the delay detecting circuit outputs a PBTI degradation detection signal upon detecting that the value of the counter is smaller than contents of the first register.
8. The semiconductor device according to claim 6,
wherein the delay detecting circuit outputs a NBT1 degradation detection signal upon detecting that the value of the counter is smaller than contents of the first register.
9. A semiconductor device comprising:
a ring oscillator; and
a delay detecting circuit which detects a delay through gate circuit based on an oscillation frequency of the ring oscillator,
wherein the delay detecting circuit comprises:
a counter which counts the oscillating frequency of the ring oscillator;
a comparator which compares a value of the counter with a reference value; and a second register to store the reference value, and
wherein the reference value is a value based on the oscillating frequency of the ring oscillator when operating at a predetermined power supply voltage,
wherein the ring oscillator comprises:
  an input terminal to which an oscillation control signal is input;
  an output terminal which outputs an oscillation signal;
  an oscillation control gate circuit having a first input terminal which is coupled to the input terminal and a second terminal to which the output terminal outputting the oscillation signal is coupled;
  NAND circuits; and
  NOR circuits,
wherein the NAND circuits and the NOR circuits are cascade coupled alternately between an output terminal of the oscillation control gate circuit gate circuit and the output terminal outputting the oscillation signal,
wherein a plurality of inputs of the NAND circuits are coupled together,
wherein a plurality of inputs of the NOT circuits are coupled together, and
wherein drive power of the NAND circuits differs from drive power of the NOR circuits.

10. The semiconductor device according to claim 9,
wherein the delay detecting circuit outputs a voltage depression detection signal upon detecting that the value of the counter is equal to the contents of the second register.

* * * * *